(12) United States Patent
Chen et al.

(10) Patent No.: US 8,658,445 B2
(45) Date of Patent: Feb. 25, 2014

(54) METHOD FOR MANUFACTURING PHOSPHOR FILM AND METHOD FOR MAKING LED PACKAGE HAVING THE PHOSPHOR FILM

(75) Inventors: Lung-Hsin Chen, Hsinchu (TW); Wen-Liang Tseng, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/600,128

(22) Filed: Aug. 30, 2012

(65) Prior Publication Data

US 2013/0217160 A1 Aug. 22, 2013

(30) Foreign Application Priority Data

Feb. 16, 2012 (CN) .......................... 2012 1 0034940

(51) Int. Cl.
*H01L 21/00* (2006.01)
(52) U.S. Cl.
USPC ............................................ 438/26; 438/127

(58) Field of Classification Search
USPC ...................... 438/26–28, 112, 124, 126–127
See application file for complete search history.

(56) References Cited

U.S. PATENT DOCUMENTS

| 6,518,600 B1 * | 2/2003 | Shaddock ........................ 257/98 |
| 6,828,170 B2 * | 12/2004 | Roberts et al. .................. 438/27 |
| 6,909,234 B2 * | 6/2005 | Chen .............................. 313/512 |

* cited by examiner

*Primary Examiner* — Richard Booth
(74) *Attorney, Agent, or Firm* — Altis Law Group, Inc.

(57) ABSTRACT

A method for manufacturing a phosphor film for use in the an LED package, includes following steps: providing a mold comprising a first and a second molding part, the first molding part and the second molding part cooperatively forming a molding chamber, the first molding part defining an opening communicating with the molding chamber; filling a mixture of phosphor particles and a transparent glue into the first opening; moving a piston in the first opening along a direction from the first molding part to the second molding part, thereby pressing the mixture into the molding chamber; solidifying the mixture to form a phosphor film; and removing the phosphor film from the mold. The phosphor film is used to be attached to a top face of an LED chip opposite a substrate on which the LED chip is mounted.

16 Claims, 13 Drawing Sheets

METHOD FOR MANUFACTURING PHOSPHOR FILM AND METHOD FOR MAKING LED PACKAGE HAVING THE PHOSPHOR FILM

BACKGROUND

1. Technical Field

The disclosure generally relates to a method for manufacturing a phosphor film and a method for making an LED package having the phosphor film.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

An LED package generally includes a substrate, an LED chip formed on the substrate and an encapsulation to cover the LED chip. Phosphor particles are doped into the encapsulation to change color of light from the LED chip. However, the phosphor particles are easily deposited in the encapsulation and cause an uneven distribution of the phosphor particles. Therefore, lighting performance of the LED package is affected.

What is needed, therefore, is a method for manufacturing a phosphor film and an LED package having the phosphor film to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

FIGS. 7-9 are cross-sectional views showing steps of a method for making an

LED package having the phosphor film manufactured in accordance with FIGS. 1-6.

DETAILED DESCRIPTION

An embodiment of making a phosphor film and an LED package will now be described in detail below and with reference to the drawings.

Figure 1:
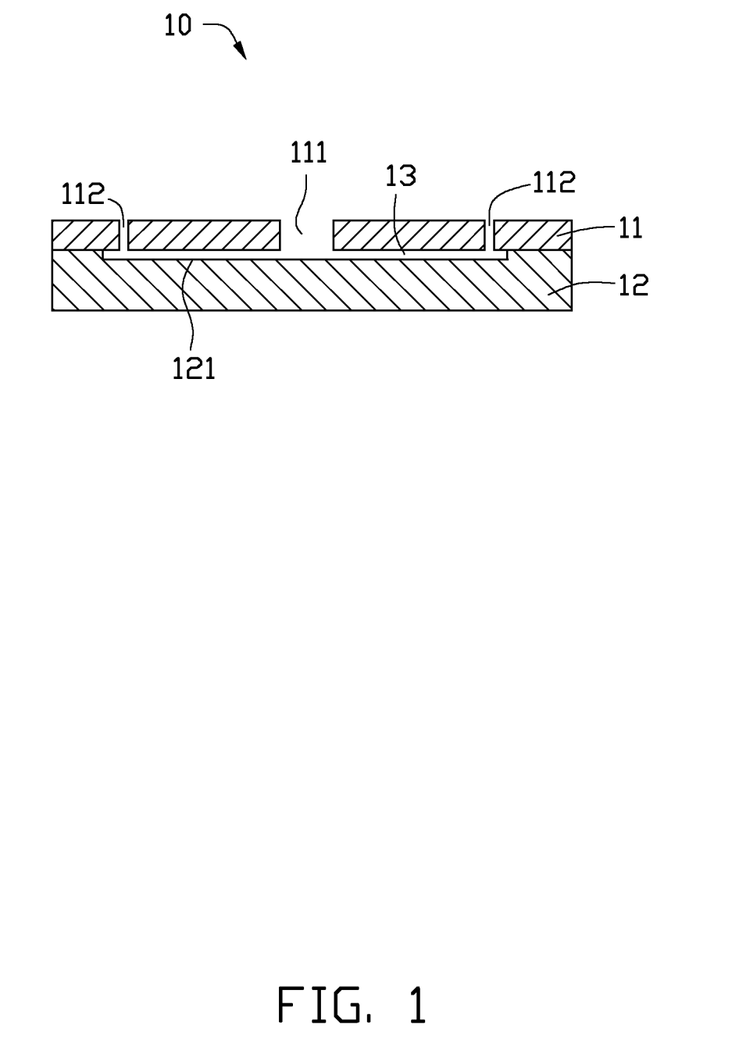
FIGS. 1-6 are cross-sectional views showing steps of a method for making a phosphor film in accordance with a first embodiment of the present disclosure.

Referring to FIG. 1, a mold 10 is provided. The mold 10 includes a first molding part 11 and a second molding part 12. The first molding part 11 and the second molding part 12 cooperatively form a molding chamber 13. A first hole 111 is defined in the first molding part 11 and communicated with the molding chamber 13. In this embodiment, a recess 121 is defined in an upper surface of the second molding part 12. The recess 121 and the first molding part 11 together form the molding chamber 13. Preferably, the first molding part 11 further defines a plurality of second holes 112. The second holes 112 are positioned at periphery of the molding chamber 13 and communicated with the molding chamber 13. The second holes 112 are configured to exhaust air inside the molding chamber 13 when a molding material is pressed into the chamber 13.

Figure 2:
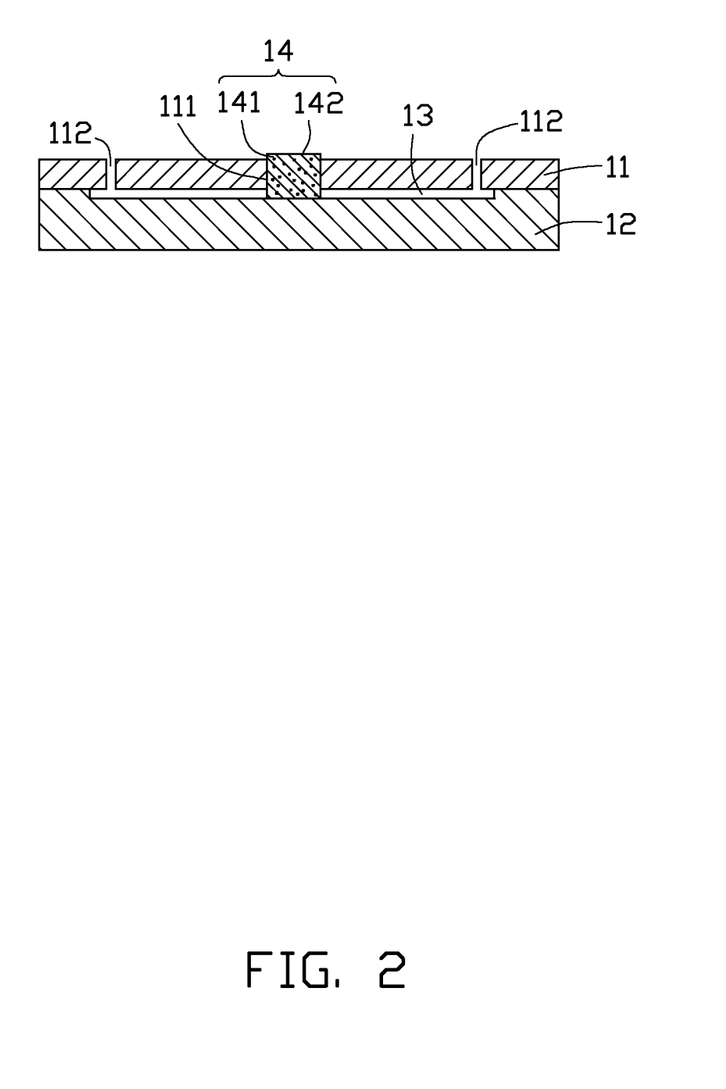

Referring to FIG. 2, a mixture 14 of phosphor particles 141 and a transparent glue 142 is filled in the first hole 111 of the first molding part 11. The phosphor particles 141 are made of a material selected from a group consisting of sulfides, silicates, nitrides, nitrogen oxides, hydroxid, garnets and mixtures thereof. The transparent glue 142 is selected from silicone or epoxy resin. In this embodiment, the phosphor particles 141 are uniformly distributed in the transparent glue 142.

Figure 3:
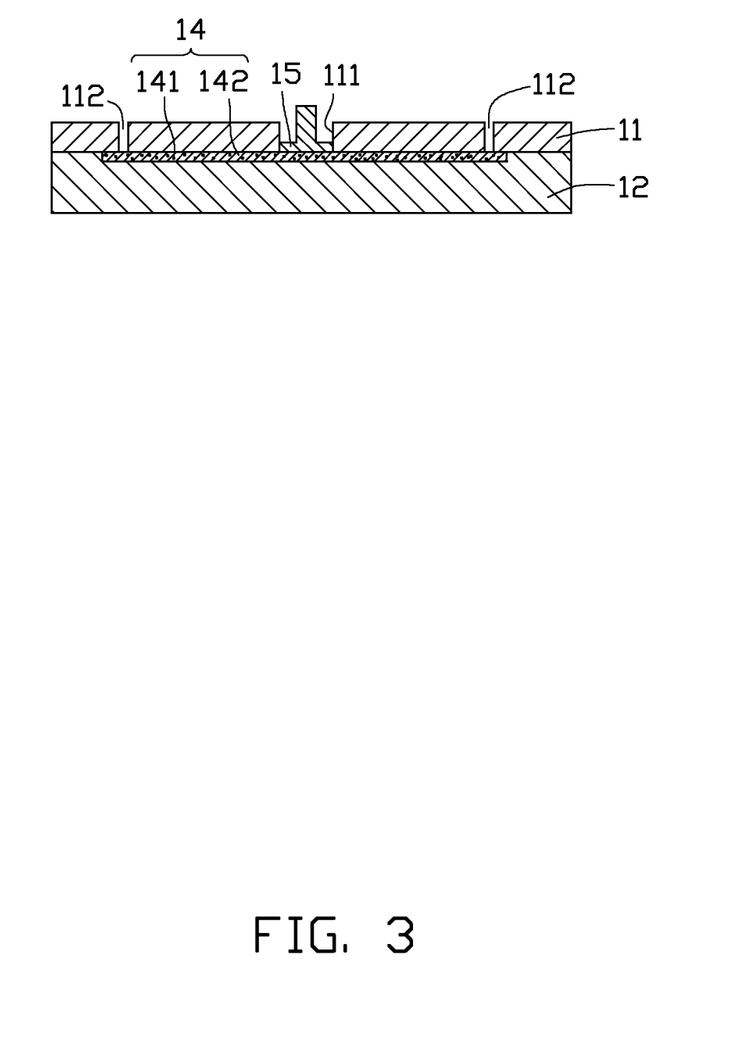

Referring to FIG. 3, a piston 15 is provided. The piston 15 has an area less than that of the first hole 111; therefore the piston 15 can be inserted into the first hole 111. The piston 15 moves along a direction from the first molding part 11 towards the second molding part 12, and pushes the mixture 14 of the phosphor particles 141 and the transparent glue 142 into the molding chamber 13. The chamber 13 is filled up with the mixture 14. Air in the chamber 13 is exhausted to outer environment through the second holes 112.

Figure 4:
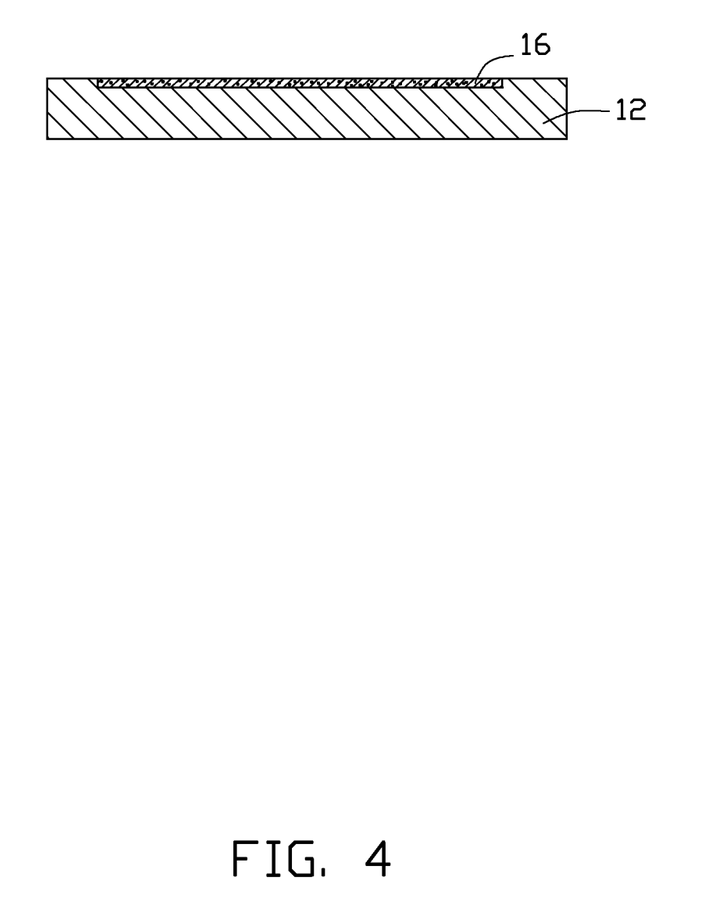

Referring to FIG. 4, after the mixture 14 of the phosphor particles 141 and the transparent glue 142 has filled the chamber 13, the mixture 14 is solidified to form a phosphor film 16. After that, the first molding part 11 and the second molding part 12 are removed from the phosphor film 16.

Figure 5:
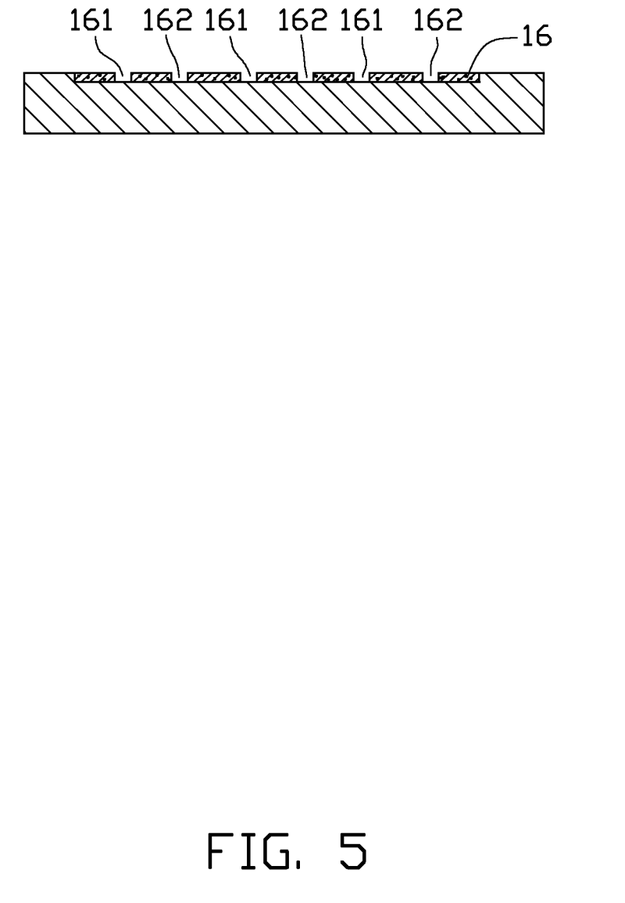

In an alternative embodiment, before removing the phosphor film 16 from the mold 10, the phosphor film 16 can be processed by patterning. Referring to FIG. 5, before the phosphor film 16 is solidified, the phosphor film 16 defines a plurality of first through holes 161 and a plurality of second through holes 162 by cutting, pressing or etching.

Figure 6:
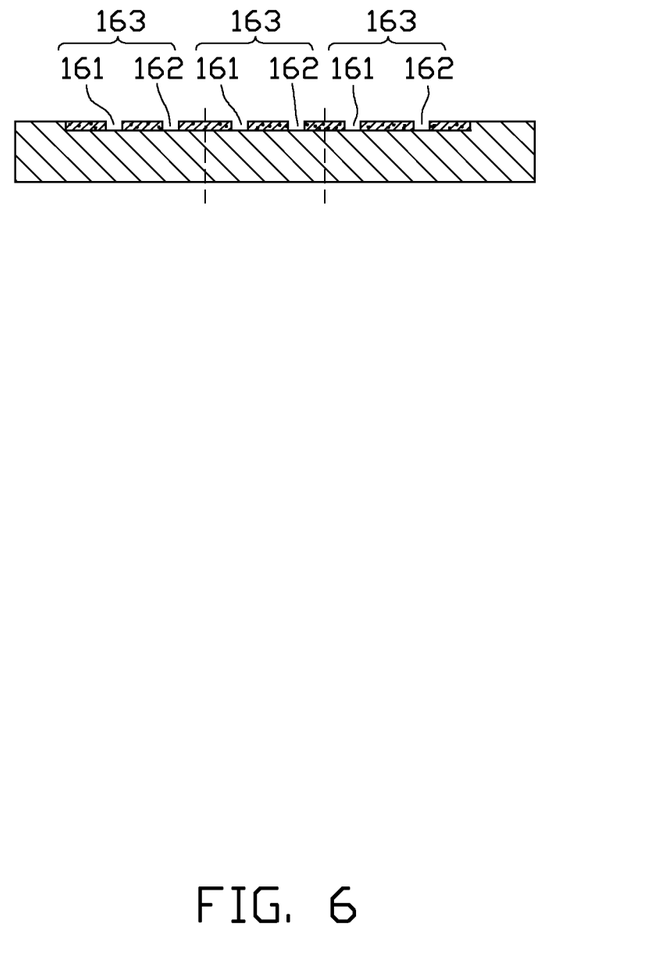

Referring to FIG. 6, the phosphor film 16 is cut to form a plurality of phosphor film units 163. Each phosphor film unit 163 includes at least one first through hole 161 and at least one second through hole 162.

In the method for manufacturing the phosphor film 16 described above, because the mixture 14 of the phosphor particles 141 and the transparent glue 142 is pressed into molding chamber 13 by the piston 15 to form the phosphor film 16, a thickness of the phosphor film 16 can be easily controlled. In addition, in the process of filling the mixture 14 into the molding chamber 13, the phosphor particles 141 and the transparent glue 142 are mixed together continuously therefore making the phosphor particles 141 uniformly distributed in the transparent glue 142.

The phosphor film 16 can be applied to an LED package.

Figure 7:
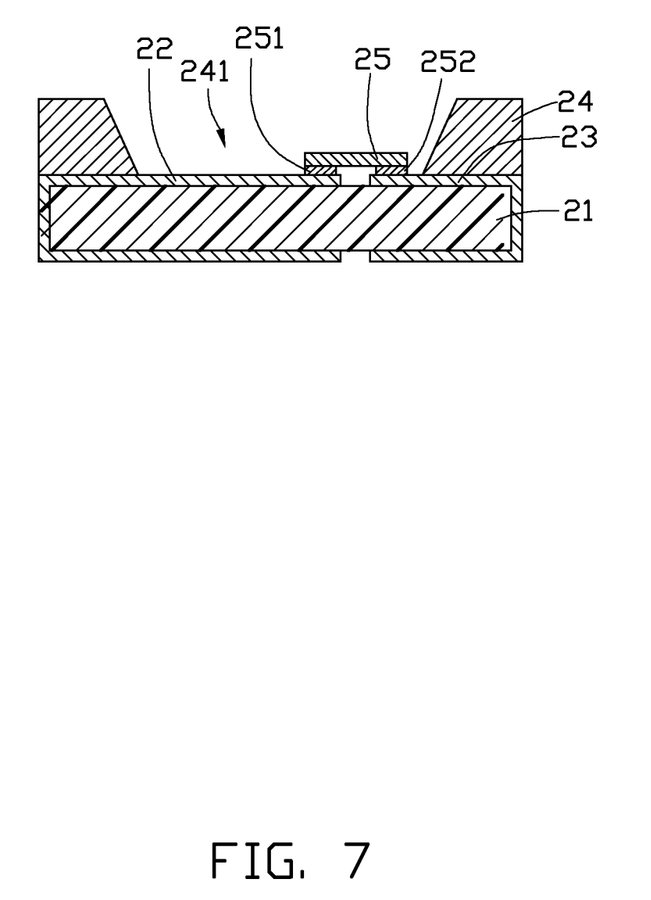

Referring to FIG. 7, a substrate 21 is provided. A first electrode 22 and a second electrode 23 are formed on an upper surface of the substrate 21. In this embodiment, the first electrode 22 extends from the upper surface of the substrate 21 to a bottom surface of the substrate 21. The second electrode 23 also extends from the upper surface of the substrate 21 to the bottom surface of the substrate 21. A reflector cup 24 is further formed on the upper surface of the substrate 21. The reflector cup 24 and the substrate 21 together form a reflector chamber 241. An opening of the reflector chamber 241 gradually increases in a direction away from the substrate 21. Then, an LED chip 25 is arranged on the substrate 21. The LED chip 25 has a first electrode pad 251 and a second electrode pad 252 on a surface facing the substrate 21. The first electrode pad 251 and the second electrode pad 252 are electrically connected with the first electrode 22 and the second electrode 23 by soldering. In this embodiment, the LED chip 25 is formed inside the reflector cup 241. That is, the reflector cup 241 surrounds the LED chip 25. Light from the LED chip 25 to the reflector cup 24 is reflected by an inner surface of the reflector cup 241, and emits to outer environment in a direction in front of the LED chip 25.

Figure 8:
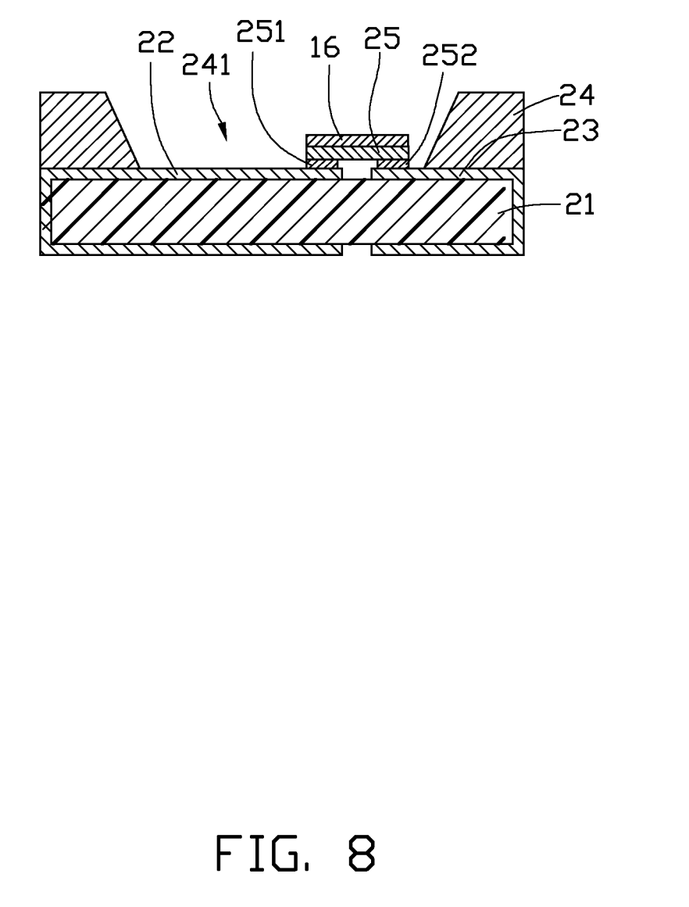

Referring to FIG. 8, the phosphor film 16 is attached to a surface of the LED chip 25 opposite to the substrate 21. Light from the LED chip 25 passes through the phosphor film 16 and emits to outer environment.

Figure 9:
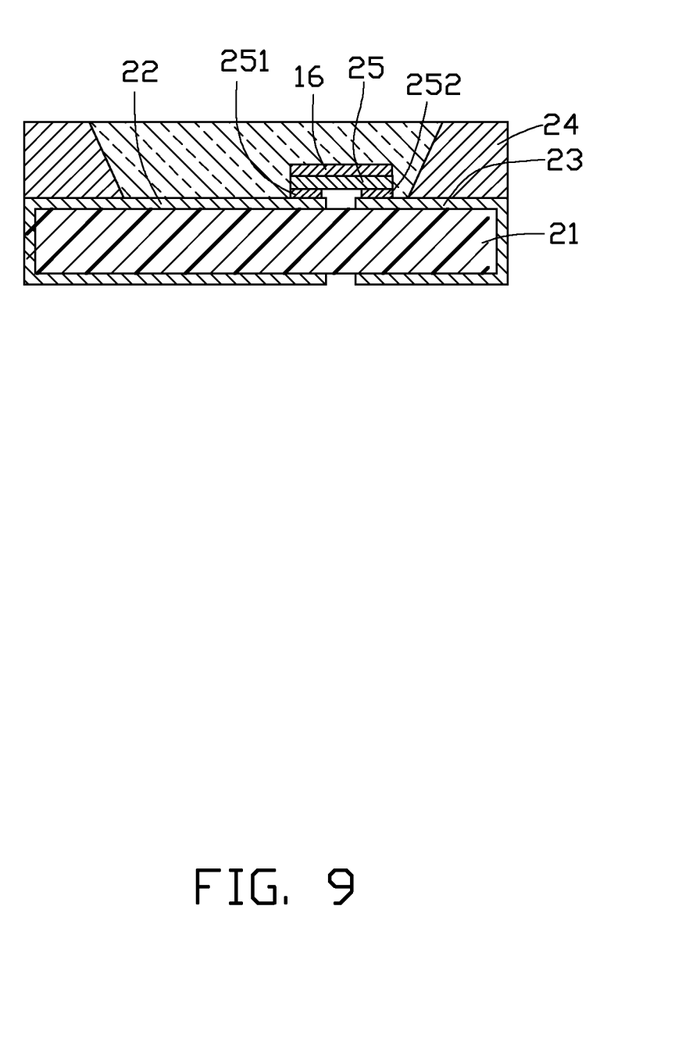

Referring to FIG. 9, a transparent encapsulation 26 can further be formed inside the reflector cup 241 and covers the LED chip 25 and the phosphor film 16. The transparent encapsulation 26 is configured to prevent the LED chip 25 and the phosphor film 16 from being affected by moisture or dust.

FIGS. 10-13 show steps of a method for making an LED package in accordance with another embodiment.

Figure 10:
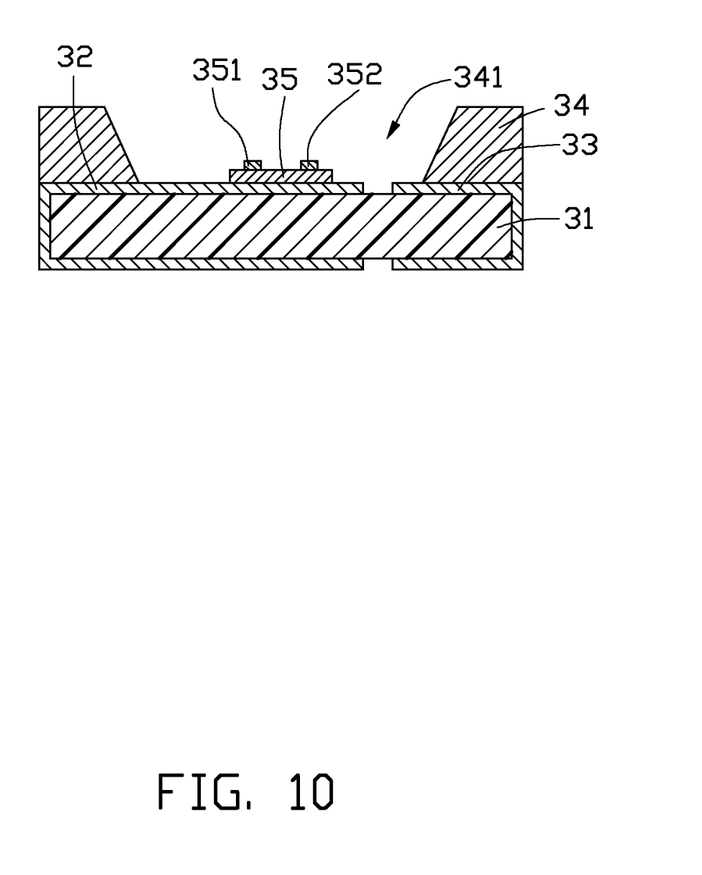
FIGS. 10-13 are cross-sectional views showing steps of a method for making an LED package in accordance with another embodiment of the present disclosure.

Referring to FIG. 10, a substrate 31 is provided. A first electrode 32 and a second electrode 33 are formed on an upper surface of the substrate 31. In this embodiment, the first electrode 32 extends from the upper surface of the substrate 31 to a bottom surface of the substrate 31. The second electrode 33 also extends from the upper surface of the substrate 31 to the bottom surface of the substrate 31. A reflector cup 34 is further formed on the upper surface of the substrate 31. The reflector cup 34 and the substrate 31 together form a reflector chamber 341. An opening of the reflector chamber 341 gradually increases in a direction away from the substrate 31. Then, an LED chip 35 is arranged on the substrate 31. The LED chip 35 has a first electrode pad 351 and a second electrode pad 352 on a surface facing away from the substrate 31. The LED chip 35 is secured on a top surface of the first electrode 32 via a thermally conductive and electrically insulating glue which adheres a bottom surface of the LED chip 35 to the first electrode 32. In this embodiment, the LED chip 35 is formed inside the reflector cup 341. That is, the reflector cup 341 surrounds the LED chip 35. Light from the LED chip 35 to the reflector cup 34 is reflected by an inner surface of the reflector cup 341, and emits to outer environment in a direction in front of the LED chip 35.

Figure 11:
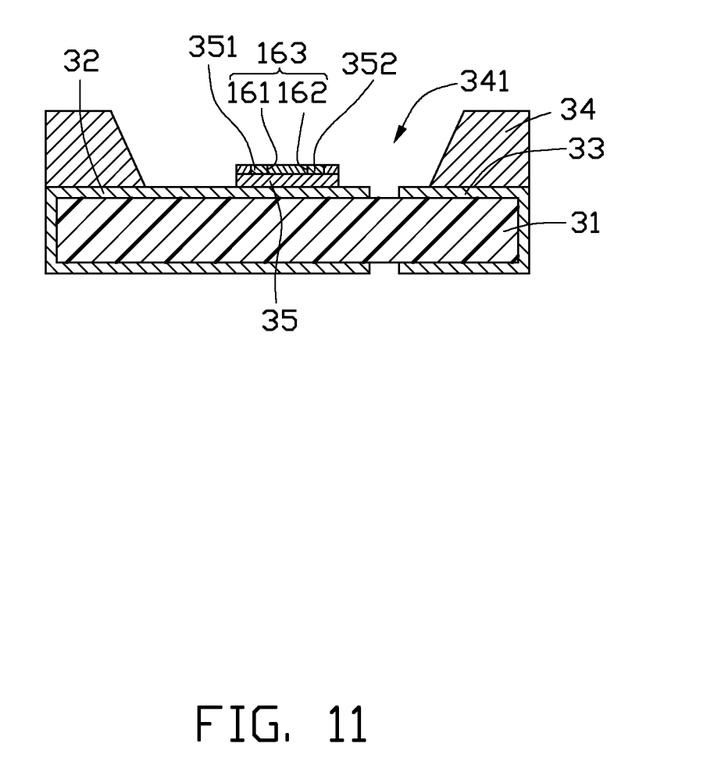

Referring to FIG. 11, the phosphor film unit 163 is attached to a surface of the LED chip 35 opposite to the substrate 31. The first electrode pad 351 passes through the first through hole 161, and the second electrode pad 352 passes through the second through hole 162.

Figure 12:
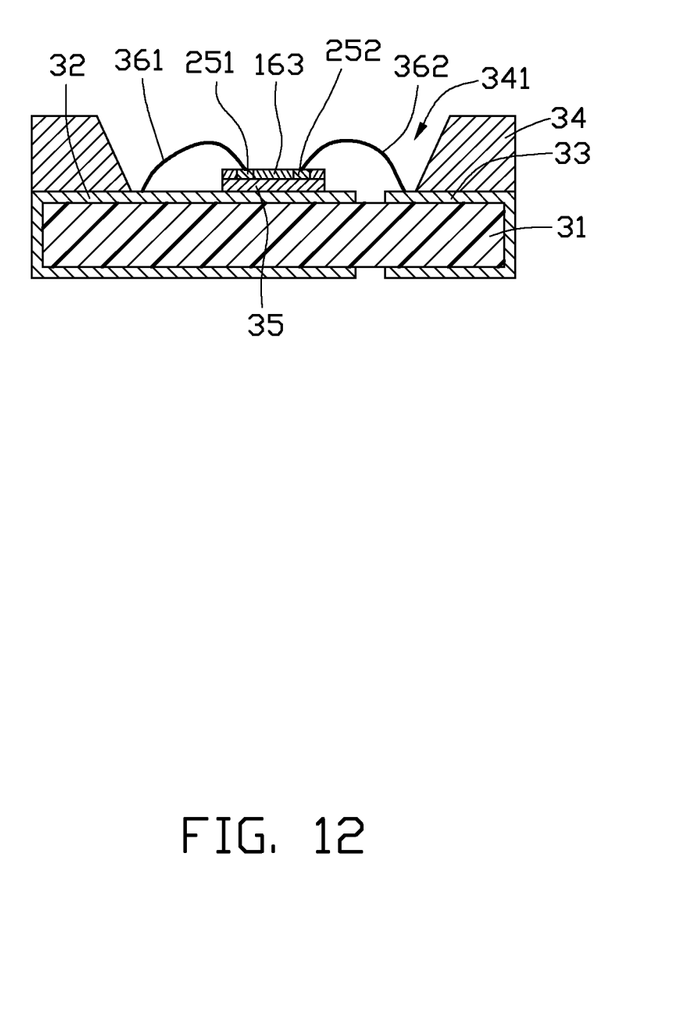

Referring to FIG. 12, the first electrode pad 351 is electrically connected with the first electrode 32 by a wire 361. The second electrode pad 352 is electrically connected with the second electrode 33 by another wire 362.

Figure 13:
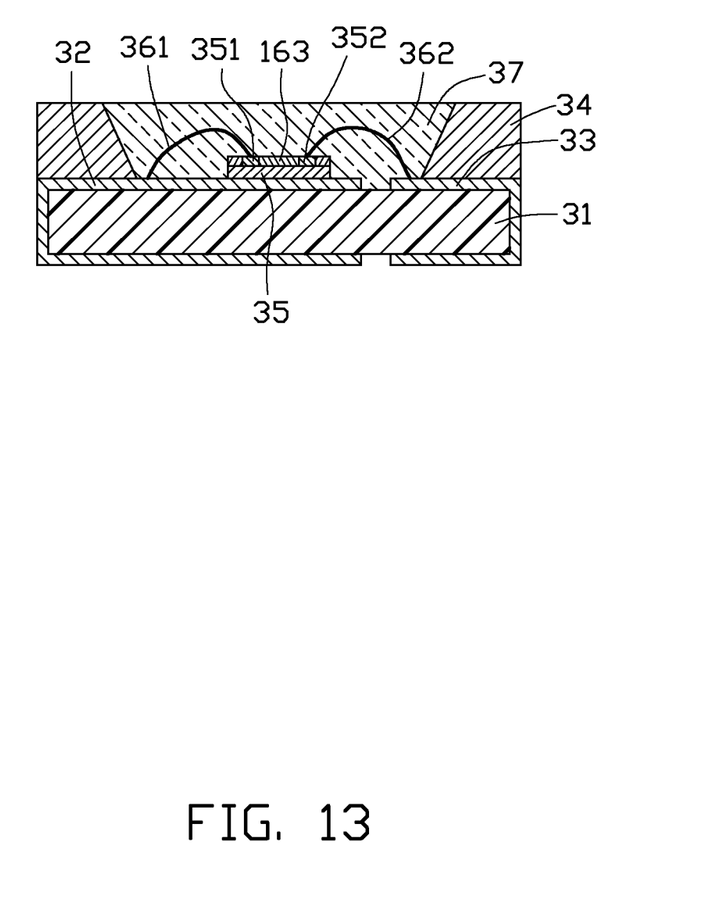

Referring to FIG. 13, a transparent encapsulation 37 is formed inside the reflector chamber 341 to cover the LED chip 35 and the phosphor film unit 163. The transparent encapsulation 37 is configured to prevent the LED chip 35, the phosphor film unit 163 and the wires 361, 362 from being affected by moisture or dust.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a phosphor film for use in an LED (light emitting diode) package to change color of light from the LED package, comprising following steps:
   providing a mold, the mold comprising a first molding part and a second molding part, the first molding part and the second molding part cooperatively forming a molding chamber, the first molding part defining an opening communicating with the molding chamber;
   filling a mixture of phosphor particles and a transparent glue into the first opening;
   providing a piston, the piston moving in the first opening along a direction from the first molding part to the second molding part, thereby pressing the mixture of the phosphor particles and the transparent glue into the molding chamber;
   solidifying the mixture of the phosphor particles and the transparent glue to form a phosphor film; and
   removing the phosphor film from the mold.

2. The method of claim 1, wherein the mold further comprises a plurality of second holes, the second holes are formed at a periphery of the first molding part and communicated with the molding chamber, and wherein when the mixture of the phosphor particles and the transparent glue is filled into the molding chamber, air in the molding chamber exhausts into outer environment through the second holes.

3. The method of claim 1, wherein before removing the phosphor film from the mold, the phosphor film is patterned to form a plurality of first through holes and second through holes, then the phosphor film is cut into a plurality of phosphor film units, each phosphor film unit comprises a first through hole and a second through hole.

4. The method of claim 3, wherein the phosphor film is patterned by cutting, pressing or etching.

5. The method of claim 1, wherein the phosphor particles are made of a material selected from a group consisting of sulfides, silicates, nitrides, nitrogen oxides, hydroxid, garnets and mixtures thereof.

6. The method of claim 1, wherein the transparent glue is made of a material selected from a group consisting of silicone and epoxy resin.

7. A method for making an LED package, comprising following steps:
   providing a substrate, the substrate comprising a first electrode and a second electrode on an upper surface thereof;
   forming an LED chip on the substrate, the LED chip having a first electrode pad and a second electrode pad; and
   attaching a phosphor film to a surface of the LED chip opposite to the substrate, the first electrode pad being electrically connected with the first electrode, and the second electrode pad being electrically connected with the second electrode, the phosphor film being manufactured in following steps:
   providing a mold, the mold comprising a first molding part and a second molding part, the first molding part and the second molding part cooperatively forming a molding chamber, the first molding part defining an opening communicating with the molding chamber;
   filling a mixture of phosphor particles and a transparent glue into the first opening;
   providing a piston, the piston moving in the first opening along a direction from the first molding part to the second molding part, thereby pressing the mixture of the phosphor particles and the transparent glue into the molding chamber;
   solidifying the mixture of the phosphor particles and the transparent glue to form a phosphor film; and
   removing the phosphor film from the mold.

8. The method of claim 7, wherein a reflector cup is formed on the surface of the substrate having the LED chip, the reflector cup surrounds the LED chip, the reflector cup and the substrate cooperatively form a reflector chamber, an opening of the reflector chamber gradually increases in a direction away from the LED chip.

9. The method of claim 7, wherein a transparent encapsulation is formed inside the reflector chamber to cover the LED chip and the phosphor film.

10. The method of claim 7, wherein the mold further comprises a plurality of second holes, the second holes are formed at a periphery of the first molding part and communicated with the molding chamber, when the mixture of the phosphor particles and the transparent glue is filled into the molding chamber, air in the molding chamber exhausts into outer environment through the second holes.

11. The method of claim 7, wherein before removing the phosphor film from the mold, the phosphor film is patterned to form a plurality of first through holes and second through holes, then the phosphor film is cut into a plurality of phosphor film units, each phosphor film unit comprises a first through hole and a second through hole.

12. The method of claim 11, wherein the phosphor film is patterned by cutting, pressing or etching.

13. The method of claim 11, wherein the step of attaching a phosphor film to a surface of the LED chip opposite to the substrate is to attach one of the phosphor film units to the surface of the LED chip, with the first electrode pad passing through the first through hole, and the second electrode pad passing through the second through hole of the one of the phosphor film units.

14. The method of claim 13, wherein the first electrode pad and the second electrode pad are electrically connected with the first electrode and the second electrode by wires.

15. The method of claim 7, wherein the phosphor particles are made of a material selected from a group consisting of sulfides, silicates, nitrides, nitrogen oxides, hydroxid, garnets and mixtures thereof.

16. The method of claim 7, wherein the transparent glue is made of a material selected from a group consisting of silicone and epoxy resin.

* * * * *